United States Patent
Mohanty et al.

(10) Patent No.: US 10,147,483 B1
(45) Date of Patent: Dec. 4, 2018

(54) ROBUST WRITE DRIVER SCHEME FOR STATIC RANDOM ACCESS MEMORY COMPILERS

(71) Applicant: QUALCOMM Incorporated, San Diego, CA (US)

(72) Inventors: Shiba Narayan Mohanty, Bangalore (IN); Mukund Narasimhan, Bangalore (IN); Rakesh Kumar Sinha, Bangalore (IN); Raghav Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/708,818

(22) Filed: Sep. 19, 2017

(51) Int. Cl.
  *G11C 11/00* (2006.01)
  *G11C 11/419* (2006.01)
(52) U.S. Cl.
  CPC .................. *G11C 11/419* (2013.01)
(58) Field of Classification Search
  CPC .................................... G11C 11/419
  USPC ....................................... 365/154
  See application file for complete search history.

(56) References Cited

U.S. PATENT DOCUMENTS

| | | | |
|---|---|---|---|
| 8,582,351 B2 | 11/2013 | Arsovski et al. | |
| 9,019,752 B1 | 4/2015 | Puckett et al. | |
| 9,548,104 B1 | 1/2017 | Braceras et al. | |
| 9,640,540 B1 | 5/2017 | Liaw | |
| 2011/0205812 A1* | 8/2011 | Kajigaya | G11C 11/4091 |
| | | | 365/189.05 |
| 2015/0357013 A1 | 12/2015 | Park et al. | |
| 2018/0166129 A1* | 6/2018 | Mehta | G11C 11/419 |

* cited by examiner

*Primary Examiner* — Hoai V Ho
(74) *Attorney, Agent, or Firm* — Loza & Loza LLP

(57) ABSTRACT

Systems, methods, and apparatus for writing data into a static random access memory (SRAM) are provided. A write driver circuit includes a bitcell array, a bitline coupled to the bitcell array, and a first driving circuit configured to drive the bitline via a write driver node for writing data into a bitcell for a write operation. The write driver circuit also includes a pre-charging circuit configured to control or to operate with the write driver circuit to drive the write driver node to a high voltage level or a low voltage level for the write operation, and pre-charge the write driver node to the high voltage level, and float the write driver node for a bit-masking operation.

27 Claims, 9 Drawing Sheets

ROBUST WRITE DRIVER SCHEME FOR STATIC RANDOM ACCESS MEMORY COMPILERS

TECHNICAL FIELD

The present disclosure relates generally to an apparatus operating a memory and, more particularly, to facilitating robust behavior of static random access memory (SRAM).

BACKGROUND

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic read access memory (DRAM) for example. An SRAM contains a plurality of SRAM bitcells (also referred to as "bitcells") organized in rows and columns in an SRAM data array. For any given row in an SRAM data array, each column of the SRAM data array will contain an SRAM bitcell in which a single data item or bit is stored. Access to a desired SRAM bitcell row is controlled by a corresponding wordline for read and write operations. To read data from an SRAM bitcell, a wordline is asserted to select a desired row of SRAM bitcells corresponding to a memory address of a memory access request. For a read operation (also referred to as a "memory read access"), data read from the selected SRAM bitcell is placed on a local bitline to be provided to an SRAM data output. For a write operation, data to be written to the SRAM bitcell is placed on the local bitline for the SRAM bitcell. Complementary (or inverse) local bitlines may also be employed to improve noise margins in the SRAM bitcell. Further, an SRAM data array may have multiple data sub-arrays or banks that each contain their own access circuitry and dedicated local wordlines and bitlines allowing for accesses in multiple data sub-arrays at the same time.

As processor-based computer systems continue to develop, there is a need to increase system robustness by preventing the corruption of data located in a SRAM bitcell when bit-masking is performed on the SRAM bitcell.

SUMMARY

Certain aspects of the disclosure relate to systems, apparatus, methods and techniques for writing data into a static random access memory (SRAM).

In various aspects of the disclosure, an apparatus includes a SRAM. The apparatus may further include one of a cellular phone and a mobile computing device incorporating the SRAM. The SRAM includes a bitcell array, a bitline coupled to the bitcell array, a first driving circuit configured to drive the bitline via a first write driver node for writing data into a bitcell of the bitcell array for a write operation, and a first pre-charging circuit configured to operate with the first driving circuit to drive the first write driver node to a high voltage level or a low voltage level for the write operation, pre-charge the first write driver node to the high voltage level and float the first write driver node for a bit-masking operation, wherein a threshold voltage level for writing the data into the bitcell is maintained on the bitline at a start of a write cycle in a case that the first write driver node floats at the high voltage level.

In an aspect, the first pre-charging circuit is coupled to a bitclock input and a masking signal line input, wherein the masking signal line input may control the first pre-charging circuit to operate with the first driving circuit to drive the write driver node to the high voltage level or the low voltage level in a case that the bit-masking operation is disabled. The bitclock input may control the first pre-charging circuit to operate with the first driving circuit to pre-charge the first write driver node to the high voltage level and to float the first write driver node for the bit-masking operation.

In a further aspect, the first driving circuit is coupled to a first data input, and the first driving circuit is controlled to drive the first write driver node to the high voltage level or the low voltage level further based on a voltage value at the first data input.

In an aspect, the SRAM further includes an inverse bitline coupled to the bitcell array, a second driving circuit configured to drive the inverse bitline via a second write driver node for writing the data into the bitcell for the write operation, and a second pre-charging circuit configured to operate with the second driving circuit to drive the second write driver node to the high voltage level or the low voltage level for the write operation, pre-charge the second write driver node to the high voltage level, and float the second write driver node for the bit-masking operation, wherein the threshold voltage level for writing the data into the bitcell is maintained on the inverse bitline at the start of a write cycle when the second write driver node floats at the high voltage level.

In a further aspect, the second pre-charging circuit is coupled to the bitclock input and the masking signal line input, wherein the masking signal line input may control the second pre-charging circuit to operate with the second driving circuit to drive the second write driver node to the high voltage level or the low voltage level in a case that the bit-masking operation is disabled. The bitclock input may control the second pre-charging circuit to operate with the second driving circuit to pre-charge the second write driver node to the high voltage level and to float the second write driver node for the bit-masking operation.

In another aspect, the second driving circuit is coupled to a second data input, and the second driving circuit is controlled to drive the second write driver node to the high voltage level or the low voltage level further based on a voltage value at the second data input.

In various aspects of the disclosure, a method for writing data into a static random access memory (SRAM), includes detecting whether a bit-masking operation is enabled or disabled, driving a first write driver node to a high voltage level or a low voltage level for a write operation, pre-charging the first write driver node to the high voltage level, floating the first write driver node for the bit-masking operation, and driving a bitline coupled to a bitcell of a bitcell array to write the data into the bitcell according to the high voltage level or the low voltage level at the first write driver node for the write operation, wherein a threshold voltage level for writing the data into the bitcell is maintained on the bitline at a start of a write cycle when the first write driver node floats at the high voltage level.

In an aspect, the method further includes receiving a bitclock input and a masking signal line input, wherein the masking signal line input may control to drive the first write driver node to the high voltage level or the low voltage level in a case that the bit-masking operation is disabled. The bitclock input may control to pre-charge the first write driver node to the high voltage level and to float the first write driver node for the bit-masking operation.

In a further aspect, the method further includes receiving a first data input, wherein the first write driver node is driven to the high voltage level or the low voltage level further based on a voltage value of the first data input.

In an aspect, the method further includes driving a second write driver node to the high voltage level or the low voltage level for the write operation, pre-charging the second write driver node to the high voltage level, floating the second write driver node for the bit-masking operation, and driving an inverse bitline coupled to the bitcell to write the data into the bitcell according to the high voltage level or the low voltage level at the second write driver node for the write operation, wherein a threshold voltage level for writing the data into the bitcell is maintained on the inverse bitline at the start of a write cycle when the second write driver node floats at the high voltage level.

In a further aspect, the method further includes receiving a bitclock input and a masking signal line input, wherein the masking signal line input may control to drive the second write driver node to the high voltage level or the low voltage level in a case that the bit-masking operation is disabled. The bitclock input may control to pre-charge the second write driver node to the high voltage level and to float the second write driver node for the bit-masking operation.

In another aspect, the method further includes receiving a second data input, wherein the second write driver node is driven to the high voltage level or the low voltage level further based on a voltage value of the second data input.

In various aspects of the disclosure, an apparatus for writing data into a static random access memory (SRAM), includes means for detecting whether a bit-masking operation is enabled or disabled, means for driving a first write driver node to a high voltage level or a low voltage level for a write operation, means for pre-charging the first write driver node to the high voltage level; means for floating the first write driver node for the bit-masking operation, means for driving a bitline coupled to a bitcell of a bitcell array to write the data into the bitcell according to the high voltage level or the low voltage level at the first write driver node for the write operation, wherein a threshold voltage level for writing the data into the bitcell is maintained on the bitline at a start of a write cycle when the first write driver node floats at the high voltage level, means for receiving a bitclock input and a masking signal line input, and means for receiving a first data input.

In an aspect, the apparatus further includes means for driving a second write driver node to the high voltage level or the low voltage level for the write operation, means for pre-charging the second write driver node to the high voltage level, means for floating the second write driver node for the bit-masking operation, means for driving an inverse bitline coupled to the bitcell to write the data into the bitcell according to the high voltage level or the low voltage level at the second write driver node during for the write operation, wherein a threshold voltage level for writing the data into the bitcell is maintained on the inverse bitline at the start of a write cycle when the second write driver node floats at the high voltage level, means for receiving a bitclock input and a masking signal line input, and means for receiving a second data input.

In various aspects of the disclosure, an apparatus incorporating a static random access memory (SRAM) includes a write driver circuit for writing data into the SRAM. The write driver circuit is configured to detect whether a bit-masking operation is enabled or disabled, drive a first write driver node to a high voltage level or a low voltage level for a write operation, pre-charge the first write driver node to the high voltage level, float the first write driver node for the bit-masking operation, drive a bitline coupled to a bitcell of a bitcell array to write the data into the bitcell according to the high voltage level or the low voltage level at the first write driver node for the write operation, wherein a threshold voltage level for writing the data into the bitcell is maintained on the bitline at a start of a write cycle when the first write driver node floats at the high voltage level, and receive a first data input, a bitclock input, and a masking signal line input.

In an aspect, the write driver circuit is further configured to drive a second write driver node to the high voltage level or the low voltage level for the write operation, pre-charge the second write driver node to the high voltage level, float the second write driver node for the bit-masking operation, drive an inverse bitline coupled to the bitcell to write the data into the bitcell according to the high voltage level or the low voltage level at the second write driver node for the write operation, wherein a threshold voltage level for writing the data into the bitcell is maintained on the inverse bitline at the start of a write cycle when the second write driver node floats at the high voltage level, and receive a second data input, a bitclock input, and a masking signal line input. The apparatus may further include one of a cellular phone and a mobile computing device incorporating the SRAM and the write driver circuit.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

According to certain aspects, a static random access memory (SRAM) may be implemented in an apparatus 100 such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, a mobile computing device, or any other similar functioning device.

Figure 1:
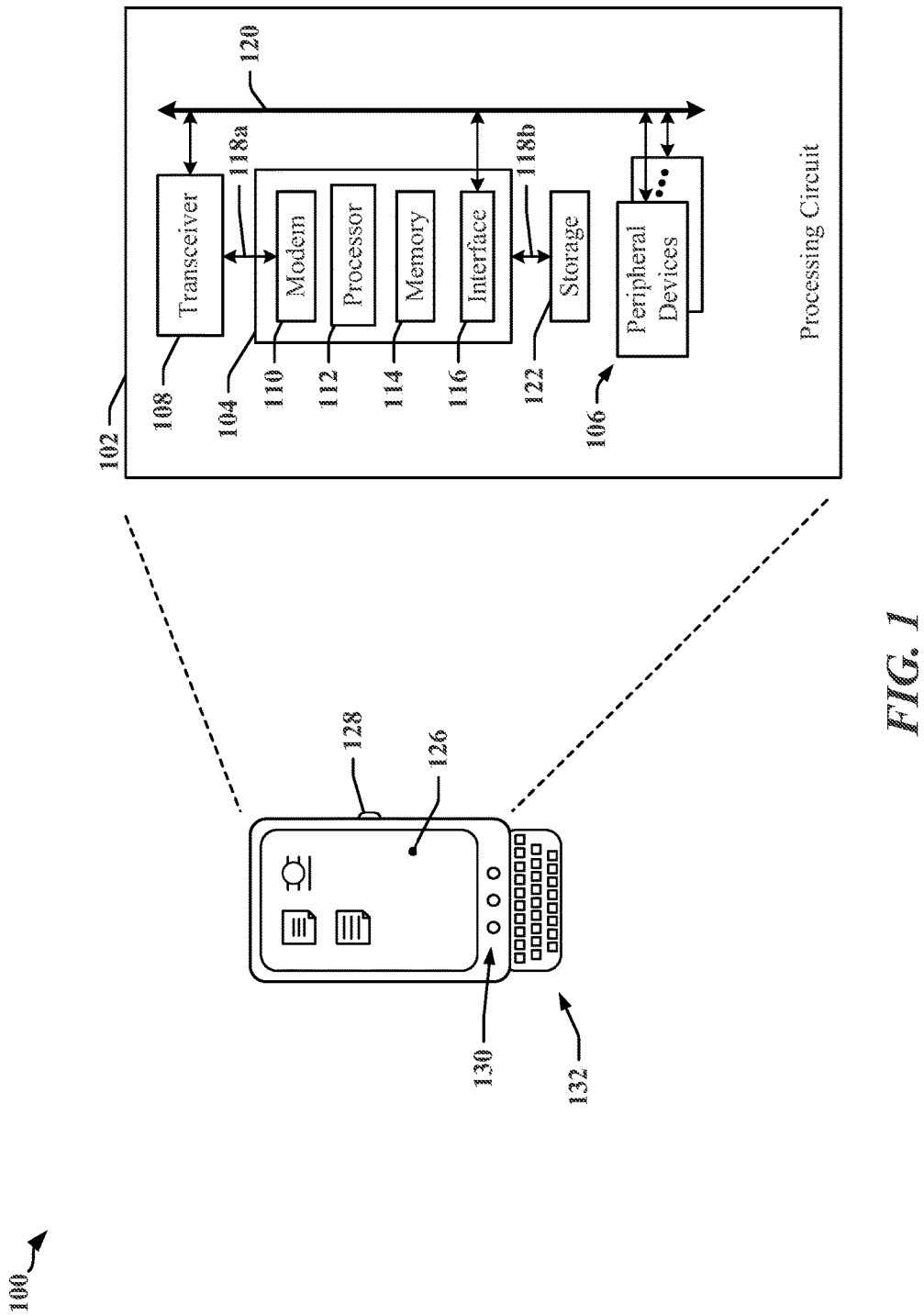
FIG. 1 illustrates an example of an apparatus that may employ a data communication bus.

FIG. 1 illustrates an example of an apparatus 100 that may employ a data communication bus. The apparatus 100 may include a processing circuit 102 having multiple circuits or devices 104, 106, and/or 108, which may be implemented in one or more application-specific integrated circuits (ASICs) or in a SoC. In one example, the apparatus 100 may be a communication device and the processing circuit 102 may include a processing device provided in an ASIC 104, one or more peripheral devices 106, and a transceiver 108 that enables the apparatus to communicate with a radio access network, a core access network, the Internet, and/or another network. The apparatus 100 may include, for example, a cell phone and/or a mobile computing device (such as a laptop or an Internet of Things (IoT) device).

The ASIC 104 may have one or more processors 112, one or more modems 110, on-board memory 114, a bus interface circuit 116, and/or other logic circuits or functions. The processing circuit 102 may be controlled by an operating system that may provide an application programming interface (API) layer that enables the one or more processors 112 to execute software modules residing in the on-board memory 114 or other processor-readable storage 122 provided on the processing circuit 102. The software modules may include instructions and data stored in the on-board memory 114 or processor-readable storage 122. The ASIC 104 may access its on-board memory 114, the processor-readable storage 122, and/or storage external to the processing circuit 102. The on-board memory 114 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as a display 126, operator controls, such as switches or buttons 128, 130, and/or an integrated or external keypad 132, among other components. A user interface module may be configured to operate with the display 126, keypad 132, etc. through a dedicated communication link or through one or more serial data interconnects.

The processing circuit 102 may provide one or more buses 118a, 118b, 120 that enable certain devices 104, 106, and/or 108 to communicate. In one example, the ASIC 104 may include a bus interface circuit 116 that includes a combination of circuits, counters, timers, control logic, and other configurable circuits or modules. In one example, the bus interface circuit 116 may be configured to operate in accordance with communication specifications or protocols. The processing circuit 102 may include or control a power management function that configures and manages the operation of the apparatus 100.

Aspects of the present disclosure relate to a write driver scheme for static random access memory (SRAM) compilers that ensures robust circuit behavior in terms of static noise margin (SNM) and writability across a compiler range (size) without impacting power and performance of the circuit. The write driver scheme may be applicable to a byte/bit writing operation in connection with a masking functionality used for SRAM.

In an aspect, an example masking functionality may be controlled by a write masking signal line (wbt_n). Notably, a masking function may not be limited to a write masking function. The masking function may refer to bits that are not written (e.g., not selected) in a write operation. When a write operation is enabled/selected, if the write masking signal line is set to a voltage value of zero (wbt_n=0), then a data input (Din) will be written in a SRAM bitcell. Hence, a column of a SRAM bitcell array will not be masked when wbt_n=0. Alternatively, when the write operation is enabled/selected, if the write masking signal line is set to a voltage value of one (wbt_n=1), then no write operation in the SRAM bitcell will occur. Hence, a column of a SRAM bitcell array will be masked when wbt_n=1.

When a column of the SRAM bitcell array is masked, a "pseudo read" function may occur in the SRAM bitcell. This ensures that a dynamic static noise margin (SNM) is bounded. If the SNM is not bounded, then data within the SRAM bitcell may corrupt. Notably, dynamic SNM is very important for yield. Accordingly, there is a need to control a state of a write driver for all dynamic operation to prevent the corruption of data.

Figure 2:
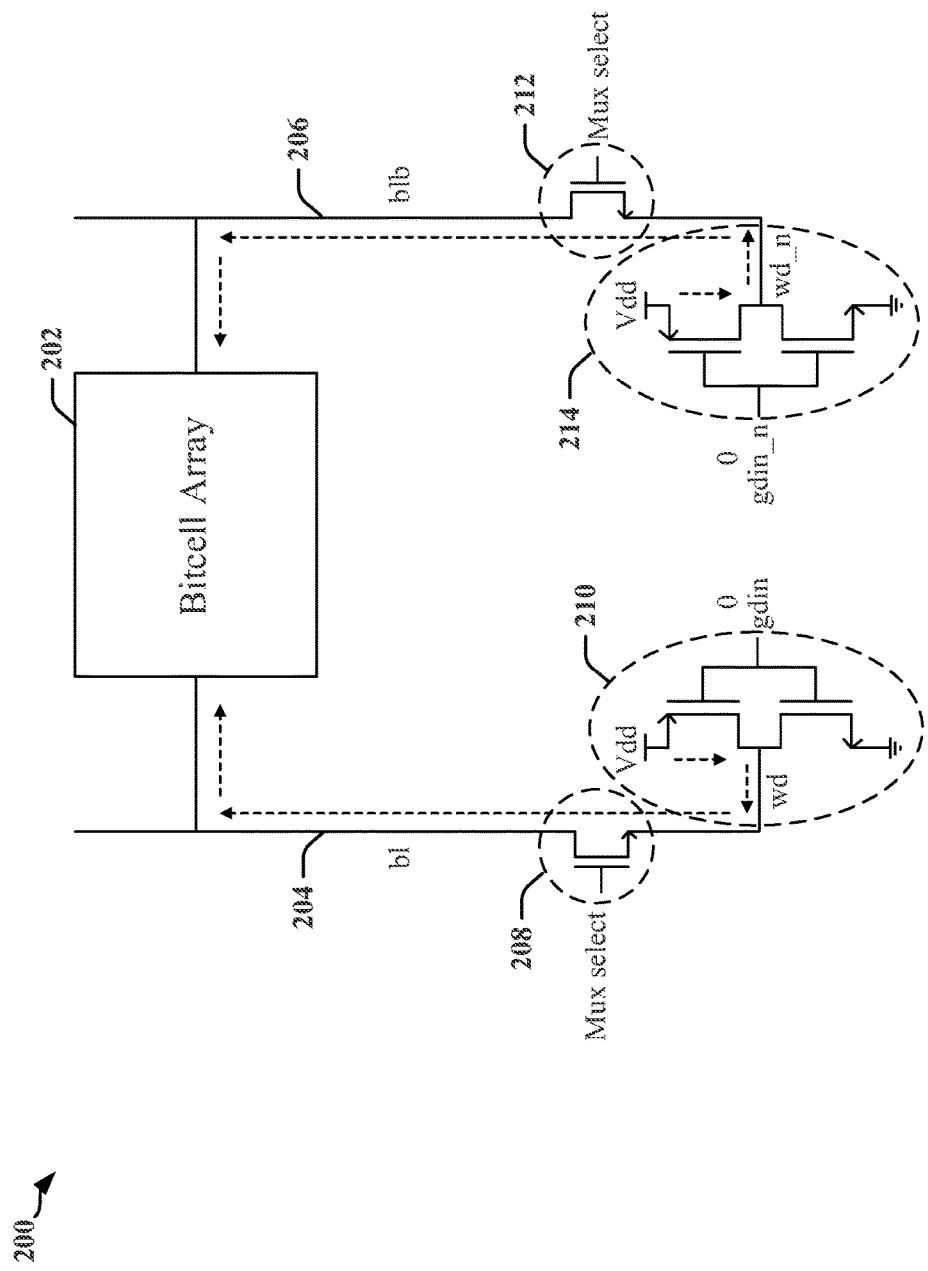
FIG. 2 illustrates an example of a static write driver scheme for a static random access memory (SRAM) bitcell.

FIG. 2 illustrates an example write driver scheme 200 for a static random access memory (SRAM) bitcell. The write driver scheme 200 may be referred to as a static write driver scheme.

The write driver scheme 200 includes a SRAM bitcell array 202 including a plurality of SRAM bitcells (also referred to as "bitcells") organized in rows and columns. For any given row in the SRAM bitcell array 202, each column of the SRAM bitcell array 202 will contain a bitcell in which a single data item or bit is stored. Each bitcell in the SRAM bitcell array 202 is coupled to a bitline (bl) 204 and an inverse bitline (or bitline bar (blb)) 206. During a write operation, data to be written to a bitcell in the SRAM bitcell array 202 is placed on the bitline (bl) 204 and/or the inverse bitline (blb) 206 for the bitcell.

The write driver scheme 200 further includes a first write multiplexer selector (first mux select) 208, which may select a column for writing data in the bitcell array 202 via the bitline (bl) 204. The bitline (bl) 204 is coupled to a drain of the first mux select 208. A source of the first mux select 208 is coupled to a first write driver node (wd), which is coupled to an output of a first driving circuit 210. The first driving circuit 210 includes a PMOS transistor and a NMOS transistor. A source of the PMOS transistor is coupled to a positive supply voltage (Vdd) and a drain of the PMOS transistor is coupled to the first write driver node (wd). A drain of the NMOS transistor is coupled to the first write driver node (wd) and a source of the NMOS transistor is coupled to a ground node. Moreover, a gate of the PMOS transistor and a gate of the NMOS transistor is coupled to a first input node (gdin).

The write driver scheme 200 further includes a second write multiplexer selector (second mux select) 212, which may select a column for writing data in the bitcell array 202 via the inverse bitline (blb) 206. The inverse bitline (blb) 206 is coupled to a drain of the second mux select 212. A source of the second mux select 212 is coupled to a second write driver node (wd_n), which is coupled to an output of a second driving circuit 214. The second driving circuit 214 includes a PMOS transistor and a NMOS transistor. A source of the PMOS transistor is coupled to the positive supply voltage (Vdd) and a drain of the PMOS transistor is coupled to the second write driver node (wd_n). A drain of the NMOS transistor is coupled to the second write driver node (wd_n) and a source of the NMOS transistor is coupled to the ground node. Moreover, a gate of the PMOS transistor and a gate of the NMOS transistor is coupled to a second input node (gdin_n).

TABLE 1

| Din | wbt_n (mask) | gdin | gdin_n |
|---|---|---|---|
| 1 | 0 | 0 | 1 |
| 0 | 0 | 1 | 0 |
| 1 | 1 | 0 | 0 |
| 0 | 1 | 0 | 0 |

Table 1 provides example values for writing a data input (Din) in a SRAM bitcell. Referring to FIG. 2, a pull-up/pull-down action may be facilitated through the PMOS transistor and the NMOS transistor of the first driving circuit 210, and the PMOS transistor and the NMOS transistor of the second driving circuit 214. Referring to FIG. 2 and Table 1, when no bit-masking is being performed (wbt_n=0), a data input (Din) of 1 may be written in the bitcell via the bitline (bl) 204 by providing a voltage value of 0 at the first input node (gdin) to put the PMOS transistor (of the first driving circuit 210) in a low resistance state and the NMOS transistor (of the first driving circuit 210) in a high resistance state. Doing so effectively pulls the first write driver node (wd) up to a high voltage level causing a data input (Din) of 1 to be written in the bitcell via the bitline (bl) 204. The data input (Din) of 1 may also be written in the bitcell via the inverse bitline (blb) 206 by providing a voltage value of 1 at the second input node (gdin_n) to put the PMOS transistor (of the second driving circuit 214) in a high resistance state and the NMOS transistor (of the second driving circuit 214) in a low resistance state. Doing so effectively pulls the second write driver node (wd_n) down to a low voltage level causing a data input (Din) of 1 to be written in the bitcell via the inverse bitline (bl) 206.

Furthermore, when no bit-masking is being performed (wbt_n=0), a data input (Din) of 0 may be written in the bitcell via the bitline (bl) 204 by providing a voltage value of 1 at the first input node (gdin) to put the PMOS transistor (of the first driving circuit 210) in a high resistance state and the NMOS transistor (of the first driving circuit 210) in a low resistance state. Doing so effectively pulls the first write driver node (wd) down to a low voltage level causing a data input (Din) of 0 to be written in the bitcell via the bitline (bl) 204. The data input (Din) of 0 may also be written in the bitcell via the inverse bitline (blb) 206 by providing a voltage value of 0 at the second input node (gdin_n) to put the PMOS transistor (of the second driving circuit 214) in a low resistance state and the NMOS transistor (of the second driving circuit 214) in a high resistance state. Doing so effectively pulls the second write driver node (wd_n) up to a high voltage level causing a data input (Din) of 0 to be written in the bitcell via the inverse bitline (bl) 206.

Further referring to FIG. 2 and Table 1, when bit-masking is being performed (wbt_n=1), the bitcell may be masked for a data input (Din) of 1 by providing a voltage value of 0 at the first input node (gdin) to pull the first write driver node (wd) up to a high voltage level and providing a voltage value of 0 at the second input node (gdin_n) to pull the second write driver node (wd_n) up to a high voltage level. Furthermore, when bit-masking is being performed (wbt_n=1), the bitcell may be masked for a data input (Din) of 0 by providing a voltage value of 0 at the first input node (gdin) to pull the first write driver node (wd) up to a high voltage level and providing a voltage value of 0 at the second input node (gdin_n) to pull the second write driver node (wd_n) up to a high voltage level.

Notably, during bit-masking (wbt_n=1), both the first write driver node (wd) and the second write driver node (wd_n) are pulled to the high voltage level due to the first input node (gdin) and the second input node (gdin_n) equaling 0. This increases stress on the bitcell, which significantly reduces an access disturb margin (ADM) or static noise margin (SNM) on the bitcell, which may result in un-intentional bit-flip. Accordingly, certain bitcell designs (e.g., 7 nm bitcell designs) implementing the write driver scheme 200 may experience a high failure rate as they may be prone to reduced ADM/SNM.

Figure 3:
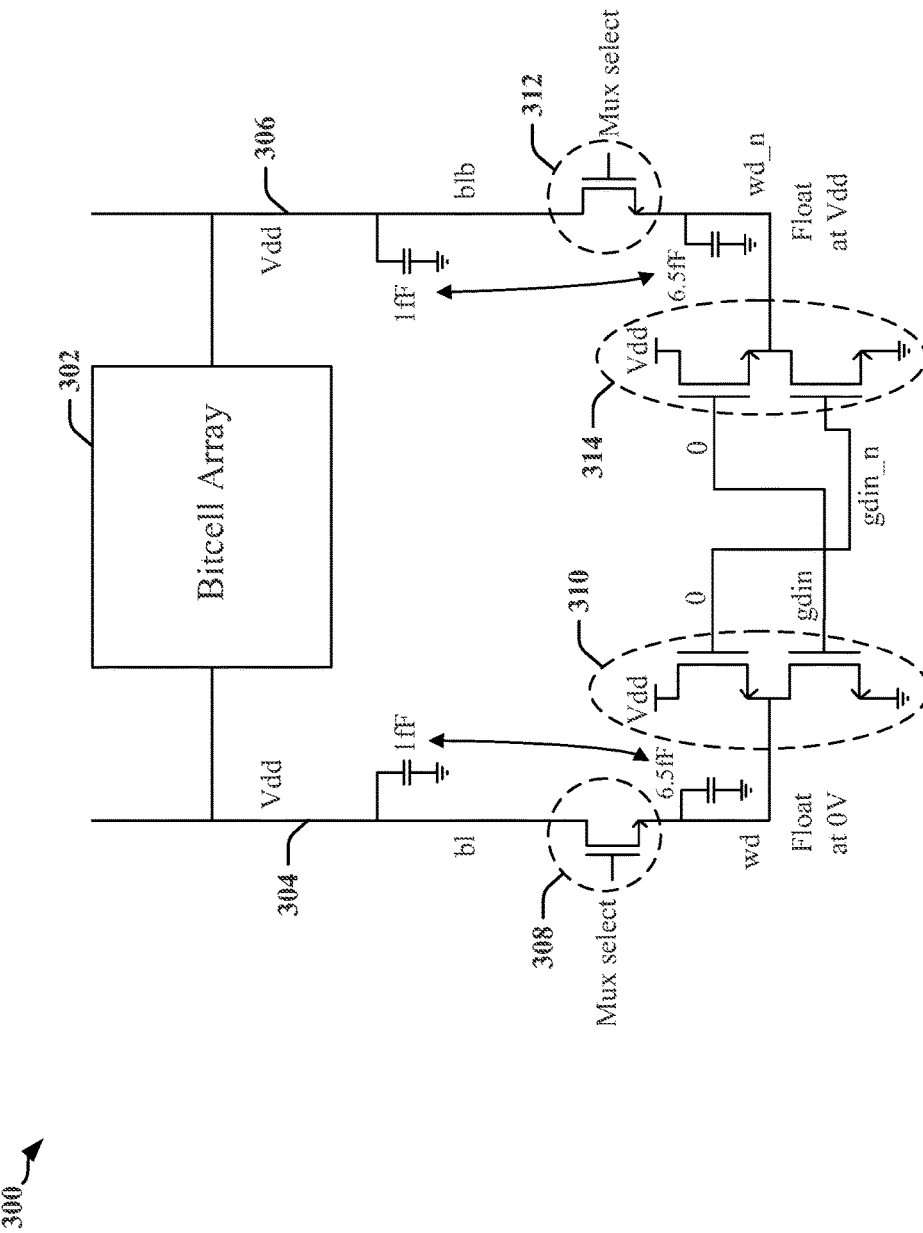
FIG. 3 illustrates an example of a floating write driver scheme for a static random access memory (SRAM) bitcell.

FIG. 3 illustrates an example write driver scheme 300 for a static random access memory (SRAM) bitcell. The write driver scheme 300 may be referred to as a floating write driver scheme.

The write driver scheme 300 includes a SRAM bitcell array 302 similar to the SRAM bitcell array 202 of FIG. 2 described above. Each bitcell in the SRAM bitcell array 302 is coupled to a bitline (bl) 304 and an inverse bitline (or bitline bar (blb)) 306. During a write operation, data to be written to a bitcell in the SRAM bitcell array 302 is placed on the bitline (bl) 304 and/or the inverse bitline (blb) 306 for the bitcell.

The write driver scheme 300 further includes a first write multiplexer selector (first mux select) 308, which may select a column for writing data in the bitcell array 302 via the bitline (bl) 304. The bitline (bl) 304 is coupled to a drain of the first mux select 308. A source of the first mux select 308 is coupled to a first write driver node (wd), which is coupled to an output of a first driving circuit 310. The first driving circuit 310 includes two NMOS transistors (e.g., a first NMOS transistor and a second NMOS transistor). A drain of the first NMOS transistor is coupled to a positive supply voltage (Vdd) and a source of the first NMOS transistor is coupled to the first write driver node (wd). A drain of the second NMOS transistor is coupled to the first write driver node (wd) and a source of the second NMOS transistor is coupled to a ground node. Moreover, a gate of the first NMOS transistor is coupled to a second input node (gdin_n) and a gate of the second NMOS transistor is coupled to a first input node (gdin).

The write driver scheme 300 further includes a second write multiplexer selector (second mux select) 312, which may select a column for writing data in the bitcell array 302 via the inverse bitline (blb) 306. The inverse bitline (blb) 306 is coupled to a drain of the second mux select 312. A source of the second mux select 312 is coupled to a second write driver node (wd_n), which is coupled to an output of a second driving circuit 314. The second driving circuit 314 includes two NMOS transistors (e.g., a third NMOS transistor and a fourth NMOS transistor). A drain of the third NMOS transistor is coupled to the positive supply voltage (Vdd) and a source of the third NMOS transistor is coupled to the second write driver node (wd_n). A drain of the fourth NMOS transistor is coupled to the second write driver node (wd_n) and a source of the fourth NMOS transistor is coupled to the ground node. Moreover, a gate of the third NMOS transistor is coupled to the first input node (gdin) and a gate of the fourth NMOS transistor is coupled to the second input node (gdin_n).

Referring to FIG. 3, a pull-up/pull-down action may be facilitated through the first NMOS transistor and the second NMOS transistor of the first driving circuit 310, and the third NMOS transistor and the fourth NMOS transistor of the second driving circuit 314. Referring to FIG. 3 and Table 1, when no bit-masking is being performed (wbt_n=0), a data input (Din) of 1 may be written in the bitcell via the bitline (bl) 304 by providing a voltage value of 1 at the second input node (gdin_n) to put the first NMOS transistor (of the first driving circuit 310) in a low resistance state and providing a voltage value of 0 at the first input node (gdin) to put the second NMOS transistor (of the first driving circuit 310) in a high resistance state. Doing so effectively pulls the first write driver node (wd) up to a high voltage level causing a data input (Din) of 1 to be written in the bitcell via the bitline (bl) 304. Notably, providing the voltage value of 0 at the first input node (gdin) also puts the third NMOS transistor (of the second driving circuit 314) in a high resistance state, and providing the voltage value of 1 at the second input node (gdin_n) puts the fourth NMOS transistor (of the second driving circuit 314) in a low resistance state. Doing so effectively pulls the second write driver node (wd_n) down to a low voltage level causing a data input (Din) of 1 to be written in the bitcell via the inverse bitline (blb) 306.

Furthermore, when no bit-masking is being performed (wbt_n=0), a data input (Din) of 0 may be written in the bitcell via the bitline (bl) 304 by providing a voltage value of 0 at the second input node (gdin_n) to put the first NMOS transistor (of the first driving circuit 310) in a high resistance state and providing a voltage value of 1 at the first input node (gdin) to put the second NMOS transistor (of the first driving circuit 310) in a low resistance state. Doing so effectively pulls the first write driver node (wd) down to a low voltage level causing a data input (Din) of 0 to be written in the bitcell via the bitline (bl) 304. Notably, providing the voltage value of 1 at the first input node (gdin) also puts the third NMOS transistor (of the second driving circuit 314) in a low resistance state and providing a voltage value of 0 at the second input node (gdin_n) also puts the fourth NMOS transistor (of the second driving circuit 314) in a high resistance state. Doing so effectively pulls the second write driver node (wd_n) up to a high voltage level causing a data input (Din) of 0 to be written in the bitcell via the inverse bitline (blb) 306.

Further referring to FIG. 3 and Table 1, when bit-masking is being performed (wbt_n=1), the bitcell may be masked for a data input (Din) of 0 or 1 by providing a voltage value of 0 at the first input node (gdin) and a voltage value of 0 at the second input node (gdin_n). This puts the first NMOS transistor and the second NMOS transistor of the first driving circuit 310 in a high resistance state, which causes the first write driver node (wd) to float (e.g., at 0 V). In this disclosure, the term "float" may refer to a state of a node that is not fixed to a particular voltage. Similarly, when the first input node (gdin) and the second input node (gdin_n) have a voltage value of 0, the third NMOS transistor and the fourth NMOS transistor of the second driving circuit 314 are put in a high resistance state, which causes the second write driver node (wd_n) to float (e.g., at Vdd).

In an aspect, when bit-masking is performed in accordance with the write driver scheme 300, the bitcell may experience no stress thus increasing reduced ADM/SNM. However, when the first mux select 308 is turned on to perform a write operation, charge is shared between the bitline (bl) 304 and the first write driver node (wd). Similarly, when the second mux select 312 is turned on to perform a write operation, charge is shared between the inverse bitline (blb) 306 and the second write driver node (wd_n). For example, as shown in FIG. 3, the bitline (bl) 304 having a capacitance of 1 fF may share charge with the first write driver node (wd) having a capacitance of 6.5 fF, and the inverse bitline (blb) 306 having a capacitance of 1 fF may share charge with the second write driver node (wd_n) having a capacitance of 6.5 fF.

In an aspect, if the capacitance of the first write driver node (wd)/second write driver node (wd_n) is much greater than the capacitance of the bitline (bl) 304/inverse bitline (blb) 306, then the voltage of the bitline (bl) 304/inverse bitline (blb) 306 may be lowered below the voltage level required for the write operation, which may cause spurious and random writes into the bitcell. In other words, when bitline/inverse bitline capacitance is much less than wd/wd_n capacitance, spurious write operations may occur due to the charge sharing. Such a problem may be more pronounced for high current bitcells and further exacerbated for two-bank designs where a write driver is shared between banks, and hence, has a very high capacitance.

Figure 4:
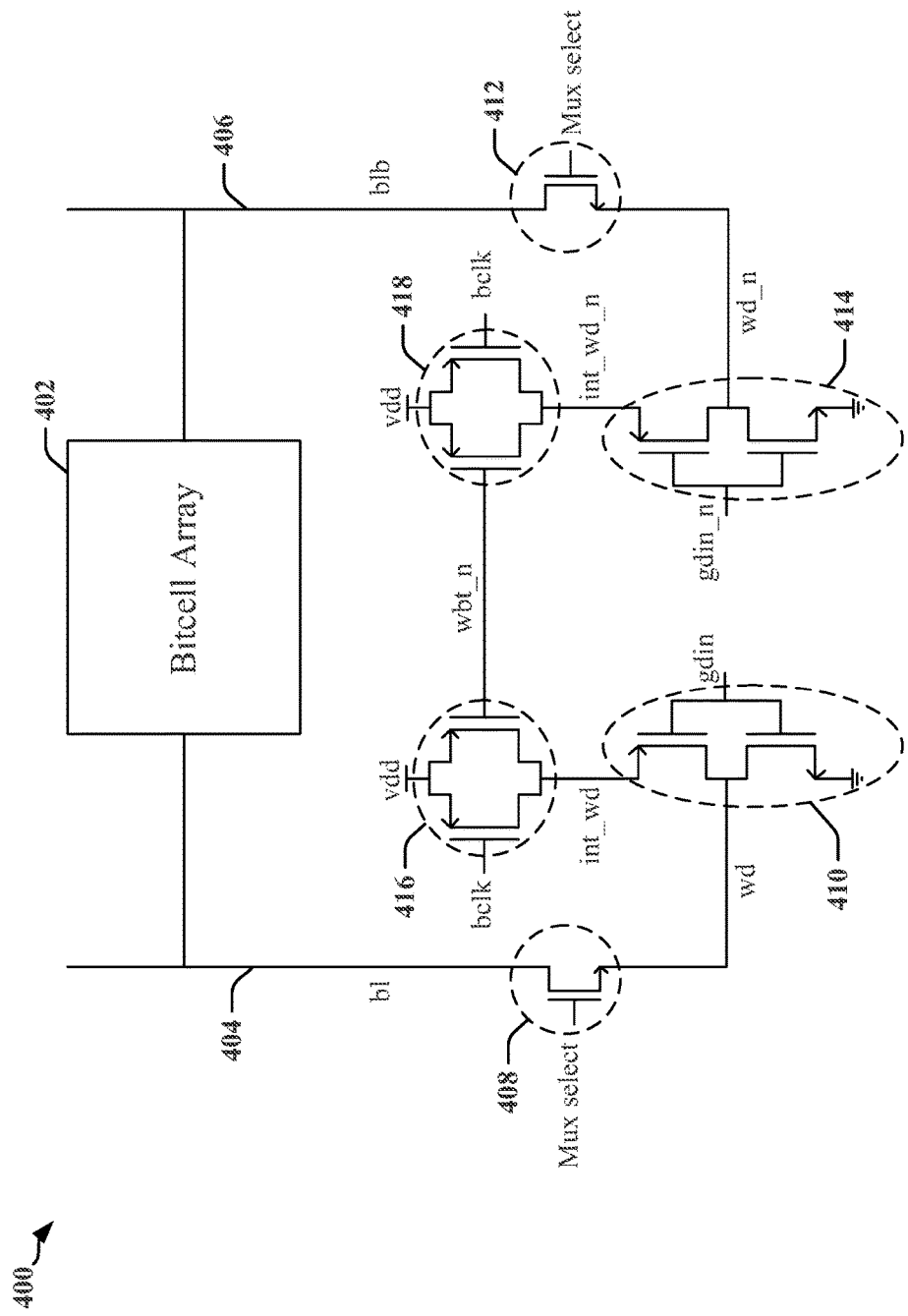
FIG. 4 illustrates an example of a pre-charged write driver scheme for a static random access memory (SRAM) bitcell.

FIG. 4 illustrates an example write driver scheme 400 for a static random access memory (SRAM) bitcell. The write driver scheme 400 may be referred to as a pre-charged write driver scheme for a masked bitcell.

The write driver scheme 400 includes a SRAM bitcell array 402 similar to the SRAM bitcell array 202 of FIG. 2 described above. Each bitcell in the SRAM bitcell array 402 is coupled to a bitline (bl) 404 and an inverse bitline (or bitline bar (blb)) 406. During a write operation, data to be written to a bitcell in the SRAM bitcell array 402 is placed on the bitline (bl) 404 and/or the inverse bitline (blb) 406 for the bitcell.

The write driver scheme 400 further includes a first write multiplexer selector (first mux select) 408, which may select a column for writing data in the bitcell array 402 via the bitline (bl) 404. The bitline (bl) 404 is coupled to a drain of the first mux select 408. A source of the first mux select 408 is coupled to a first write driver node (wd), which is coupled to an output of a first driving circuit 410. The first driving circuit 410 includes a PMOS transistor and a NMOS transistor. A drain of the PMOS transistor is coupled to the first write driver node (wd) and a source of the PMOS transistor is coupled to a first intermediate write driver node (int_wd), which is coupled to an output of a first pre-charging circuit 416. A drain of the NMOS transistor is coupled to the first write driver node (wd) and a source of the NMOS transistor is coupled to a ground node. Moreover, a gate of the PMOS transistor and a gate of the NMOS transistor is coupled to a first input node (gdin).

The first pre-charging circuit 416 may include two PMOS transistors. A source of each PMOS transistor is coupled to a positive supply voltage (Vdd) and a drain of each PMOS transistor is coupled to the first intermediate write driver node (int_wd). A gate of one PMOS transistor (of the first pre-charging circuit 416) is coupled to a write masking signal line (wbt_n) and a gate of another PMOS transistor (of the first pre-charging circuit 416) is coupled to a bitclock (bclk).

The write driver scheme 400 further includes a second write multiplexer selector (second mux select) 412, which may select a column for writing data in the bitcell array 402 via the inverse bitline (blb) 406. The inverse bitline (blb) 406 is coupled to a drain of the second mux select 412. A source of the second mux select 412 is coupled to a second write driver node (wd_n), which is coupled to an output of a second driving circuit 414. The second driving circuit 414 includes a PMOS transistor and a NMOS transistor. A drain of the PMOS transistor is coupled to the second write driver node (wd_n) and a source of the PMOS transistor is coupled to a second intermediate write driver node (int_wd_n), which is coupled to an output of a second pre-charging circuit 418. A drain of the NMOS transistor is coupled to the second write driver node (wd_n) and a source of the NMOS transistor is coupled to the ground node. Moreover, a gate of the PMOS transistor and a gate of the NMOS transistor is coupled to a second input node (gdin_n).

The second pre-charging circuit 418 may include two PMOS transistors. A source of each PMOS transistor is coupled to the positive supply voltage (Vdd) and a drain of each PMOS transistor is coupled to the second intermediate write driver node (int_wd_n). A gate of one PMOS transistor (of the second pre-charging circuit 418) is coupled to the write masking signal line (wbt_n) and a gate of another PMOS transistor (of the second pre-charging circuit 418) is coupled to the bitclock (bclk).

In an aspect, the write driver scheme 400 reduces stress on the bitcell, thus significantly improving ADM/SNM, and minimizes the chance of a spurious/accidental write operation from occurring in the bitcell. The write driver scheme 400 accomplishes this by pre-charging the first write driver node (wd) and the second write driver node (wd_n) to a high voltage level before a write cycle (e.g., during bit-masking) and cutting off the pull-up to the high voltage level during an active write cycle.

In an aspect, during an active write cycle when bit-masking is not being performed (i.e., wbt_n=0), a PMOS transistor in the first pre-charging circuit 416 controlled by the wbt_n will be put in a low resistance state, thus causing the first intermediate write driver node (int_wd) to be held to a high voltage level. When the first intermediate write driver node (int_wd) is held high, the first write driver node (wd) will be driven to a high/low voltage level depending on a voltage value of the first input node (gdin). For example, if gdin is 0, then the PMOS transistor (of the first driving circuit 410) will be put in a low resistance state and the NMOS transistor (of the first driving circuit 410) will be put in a high resistance state, thus causing the first write driver node (wd), and consequently the bitline 404, to be held to a high voltage level. If gdin is 1, then the PMOS transistor (of the first driving circuit 410) will be put in a high resistance state and the NMOS transistor (of the first driving circuit 410) will be put in a low resistance state, thus causing the first write driver node (wd), and consequently the bitline 404, to be held to a low voltage level.

Similarly, during an active write cycle when bit-masking is not being performed (i.e., wbt_n=0), a PMOS transistor in the second pre-charging circuit 418 controlled by the wbt_n will be put in a low resistance state, thus causing the second intermediate write driver node (int_wd_n) to be held to a high voltage level. When the second intermediate write driver node (int_wd_) is held high, the second write driver node (wd_n) will be driven to a high/low voltage level depending on a voltage value of the second input node (gdin_n). For example, if gdin_n is 0, then the PMOS transistor (of the second driving circuit 414) will be put in a low resistance state and the NMOS transistor (of the second driving circuit 414) will be put in a high resistance state, thus causing the second write driver node (wd_n), and consequently the inverse bitline 406, to be held to a high voltage level. If gdin_ is 1, then the PMOS transistor (of the second driving circuit 414) will be put in a high resistance state and the NMOS transistor (of the second driving circuit 414) will be put in a low resistance state, thus causing the second write driver node (wd_n), and consequently the inverse bitline 406, to be held to a low voltage level.

In an aspect, when bit-masking is being performed (i.e., wbt_n=1, gdin=0, and gdin_n=0), a PMOS transistor in the first pre-charging circuit 416 controlled by the wbt_n will be put in a high resistance state (OFF state). Accordingly, the write masking signal line (wbt_n) will not control the voltage of the first write driver node (wd) to be driven. Rather, the first write driver node (wd) will be pre-charged via the bitclock (bclk). That is, during a write cycle, the bitclock (e.g., bclk=0) will provide a signal that will facilitate a high voltage level to pre-charge the first intermediate write driver node (int_wd), and consequently, the first write driver node (wd) since gdin=0. As such, when a column in the bitcell array 402 is masked, the first write driver node (wd) is pre-charged via the bitclock (bclk). Consequently, the pre-charged first write driver node (wd) will float high (but will not hold high) at a start of a next write cycle.

Similarly, when bit-masking is being performed (i.e., wbt_n=1, gdin=0, and gdin_n=0), a PMOS transistor in the second pre-charging circuit 418 controlled by the wbt_n will be put in a high resistance state (OFF state). Accordingly, the write masking signal line (wbt_n) will not control the voltage of the second write driver node (wd_n) to be driven. Rather, the second write driver node (wd_n) will be pre-charged via the bitclock (bclk). That is, during a write cycle, the bitclock (e.g., bclk=0) will provide a signal that will facilitate a high voltage level to pre-charge the second intermediate write driver node (int_wd_n), and consequently, the second write driver node (wd_n) since gdin_n=0. As such, when a column in the bitcell array 402 is masked, the second write driver node (wd_n) is pre-charged via the bitclock (bclk). Consequently, the pre-charged second write driver node (wd_n) will float high (but will not hold high) at a start of a next write cycle. Accordingly, in one aspect of the disclosure, the bitclock (bclk) may control (e.g., clock) the first pre-charging circuit 416 (or the second pre-charging circuit 418) to operate with the first driving circuit 410 (or the second driving circuit 414) to pre-charge the first write driver node wd (or the second write driver node wd_n) and to float the first write driver node wd (or the second write driver node wd_n).

In an aspect, the first write driver node (wd) and the second write driver node (wd_n) of the write driver scheme 400 are floated high so as not to stress a bitcell within the bitcell array 402. Accordingly, because stress on the bitcell is reduced, ADM/SNM is improved.

In an aspect, the first write driver node (wd) and the second write driver node (wd_n) are pre-charged via the bitclock (bclk) to ensure that the first write driver node (wd) and the second write driver node (wd_n), and consequently the bitline (bl) 404 and the inverse bitline (blb) 406, will have a high voltage level at the beginning of a write cycle. This results in no charge sharing between the bitline (bl) 404/inverse bitline (blb) 406 and the first write driver node (wd)/second write driver node (wd_n), so that spurious write issues are eliminated.

In another aspect, a proper voltage is maintained on the first write driver node (wd) and the second write driver node (wd_n) at the time the bitline (bl) 404 and/or the inverse bitline (blb) 406 is turned on so that problems associated with charge sharing between the bitline (bl) 404/inverse bitline (blb) 406 and the first write driver node (wd)/second write driver node (wd_n) are avoided. For example, in the write driver scheme 400, the bitline/inverse bitline voltage level is maintained at a level above the voltage level required to perform a write operation, thus minimizing spurious or accidental writes even with strong charge sharing. The difference between the two signals may be managed by a bitline pre-charge tracking scheme that provides an optimum pre-charge time.

In an aspect of the disclosure, a write driver circuit 400 for a static random access memory (SRAM), includes a bitcell array 402, a bitline (bl) 404 coupled to the bitcell array 402, and a first driving circuit 410 configured to drive the bitline (bl) 404 via a first write driver node (wd) for writing data into a bitcell of the bitcell array 402 during a write cycle. The write driver circuit 400 further includes a first pre-charging circuit 416 configured to control or to operate with the first driving circuit 410 to drive the first write driver node (wd) to a high voltage level or a low voltage level during the write cycle when a bit-masking operation is disabled. The first pre-charging circuit 416 is further configured to control or to operate with the first driving circuit 410 to pre-charge the first write driver node (wd) to the high voltage level when the bit-masking operation is enabled. The pre-charged first write driver node (wd) floats at the high voltage level during the write cycle for the bit-masking operation. As such, a threshold voltage level for writing the data into the bitcell is maintained on the bitline (bl) 404 at a start of the write cycle when the pre-charged first write driver node (wd) floats at the high voltage level.

In an aspect, the first pre-charging circuit 416 is coupled to a bitclock input (bclk) and a masking signal line input (wbt_n), wherein the masking signal line input (wbt_n) enables or disables the bit-masking operation. The first driving circuit 410 is controlled to drive the first write driver node (wd) to the high voltage level or the low voltage level based on the masking signal line input (wbt_n) when the masking signal line input (wbt_n) disables the bit-masking operation. The first driving circuit 410 is controlled to pre-charge the first write driver node (wd) to the high voltage level based on the bitclock input (e.g., bclk=0) when the masking signal line input (wbt_n) enables the bit-masking operation.

In a further aspect, the first driving circuit 410 is coupled to a first data input (gdin). The first driving circuit 410 is controlled to drive the first write driver node (wd) to the high voltage level or the low voltage level further based on a voltage value at the first data input (gdin).

In an aspect of the disclosure, the write driver circuit 400 further includes an inverse bitline (blb) 406 coupled to the bitcell array 402, a second driving circuit 414 configured to drive the inverse bitline (blb) 406 via a second write driver node (wd_n) for writing the data into the bitcell during the write cycle, and a second pre-charging circuit 418. The second pre-charging circuit 418 is configured to control or to operate with the second driving circuit 414 to drive the second write driver node (wd_n) to the high voltage level or the low voltage level during the write cycle when the bit-masking operation is disabled. The second pre-charging circuit 418 is further configured to control or to operate with the second driving circuit 414 to pre-charge the second write driver node (wd_n) to the high voltage level when the bit-masking operation is enabled, wherein the pre-charged second write driver node (wd_n) floats at the high voltage level during the write cycle for the bit-masking operation. As such, the threshold voltage level for writing the data into the bitcell is maintained on the inverse bitline (blb) 406 at the start of the write cycle when the pre-charged second write driver node (wd_n) floats at the high voltage level.

In an aspect, the second pre-charging circuit 418 is coupled to the bitclock input (bclk) and the masking signal line input (wbt_n). The second driving circuit 414 is controlled to drive the second write driver node (wd_n) to the high voltage level or the low voltage level based on the masking signal line input (wbt_n) when the masking signal line input (wbt_n) disables the bit-masking operation. The second driving circuit 414 is controlled to pre-charge the second write driver node (wd_n) to the high voltage level based on the bitclock input (e.g., bclk=0) when the masking signal line input (wbt_n) enables the bit-masking operation.

In a further aspect, the second driving circuit 414 is coupled to a second data input (gdin_n). The second driving circuit 414 is controlled to drive the second write driver node (wd_n) to the high voltage level or the low voltage level further based on a voltage value at the second data input (gdin_n).

In an aspect of the disclosure, the second driving circuit 414 may drive the inverse bitline (blb) 406 via the second write driver node (wd_n) or the first driving circuit 410 may drive the bitline (bl) 404 via the first write driver node (wd). For example, the second driving circuit 414 may drive a current to flow between the second write driver node (wd_n) and the inverse bitline (blb) 406 and the first driving circuit 410 may drive a current to flow between the first write driver node (wd) and the bitline (bl) 404.

Figure 5:
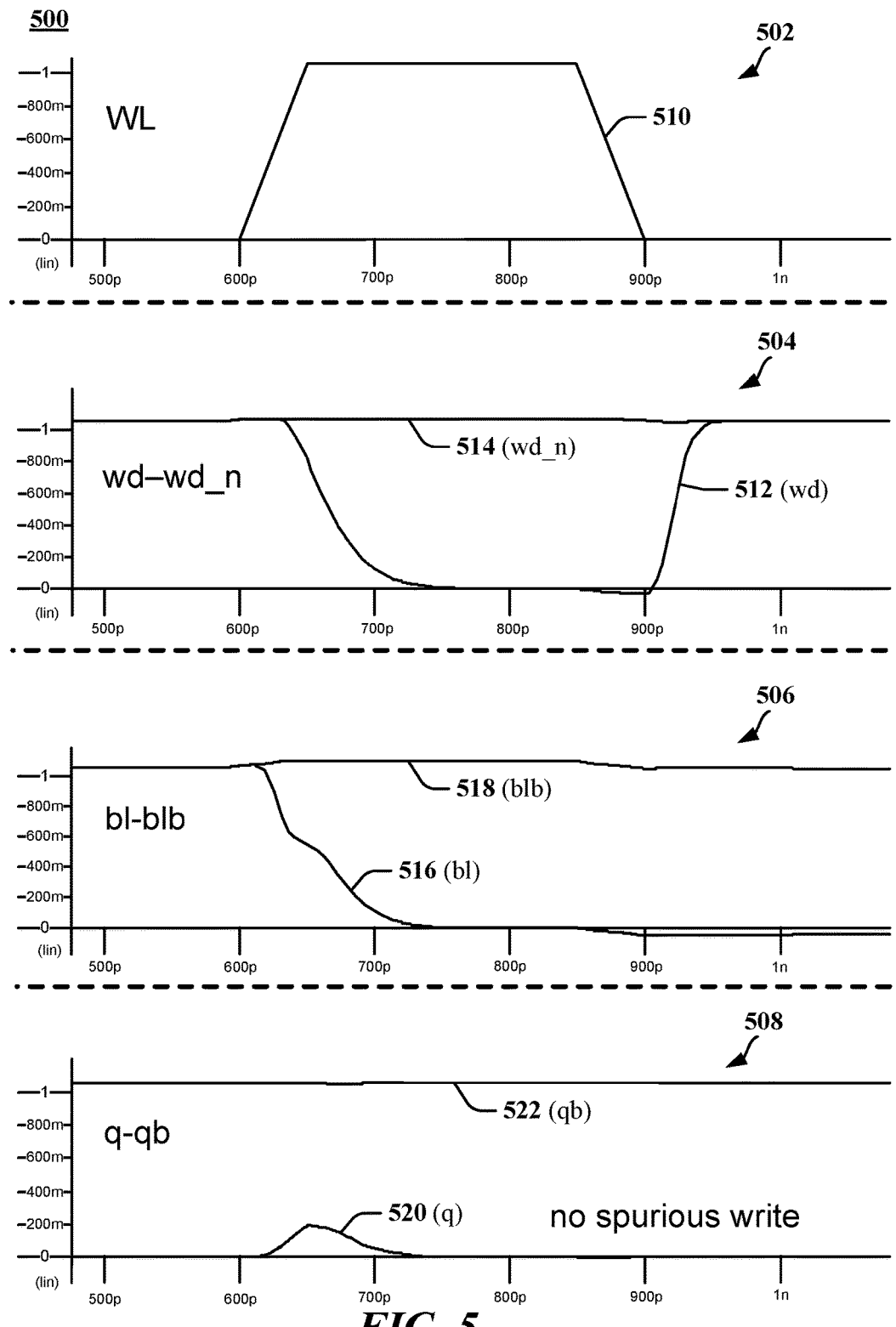
FIG. 5 is a diagram illustrating waveforms corresponding to the timings of various signals in a write driver circuit.

FIG. 5 is a diagram 500 illustrating waveforms corresponding to the timings of various signals in the write driver circuit 400. As shown, the diagram 500 is divided into four sections 502, 504, 506, and 508, each section depicting a voltage-over-time relationship (waveform) of a specific type of signal. For example, a first section 502 illustrates a waveform of a signal 510 of a wordline (WL). A second section 504 illustrates a waveform of a signal 512 at a first write driver node (wd). The second section 504 also illustrates a waveform of a signal 514 at a second write driver node (wd_n).

A third section 506 illustrates a waveform of a signal 516 at a bitline (bl) 404 as well as a waveform of a signal 518 at an inverse bitline (blb) 406. A fourth section 508 illustrates a waveform of a signal 520 at a node q, wherein the node q is a bitcell node coupled to the bitline bl (404). The fourth section 508 also illustrates a waveform of a signal 522 at a node qb, wherein the node qb is a bitcell node coupled to the inverse bitline (blb) 406. Notably, as shown by the timing of the signal 512 (*wd*) with respect to the signal 516 (*bl*) and the timing of the signal 514 (wd_n) with respect to the signal 518 (blb), no charge sharing occurs between the node wd and the bl 404 and/or the node wd_n and the blb 406. Accordingly, no spurious or accidental write operations will occur in the bitcell array 402, as shown by the timings of the signal 520 (*q*) and the signal 522 (*qb*).

Figure 6:
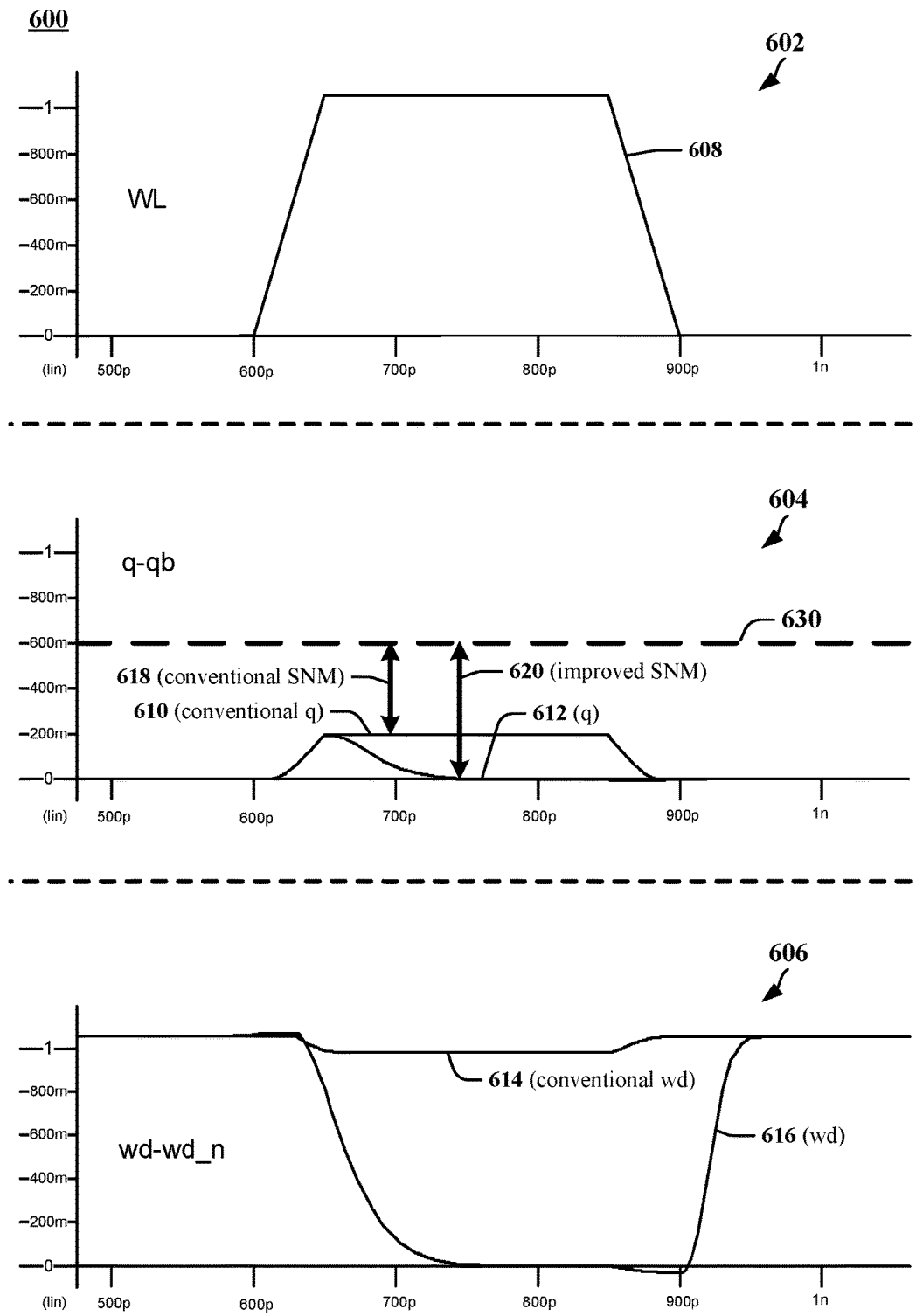
FIG. 6 is a diagram illustrating waveforms corresponding to the timings of various signals in a write driver circuit and their effect on a static noise margin (SNM).

FIG. 6 is a diagram 600 illustrating waveforms corresponding to the timings of various signals in the write driver circuit 400 and their effect on a static noise margin (SNM).

As shown, the diagram 600 is divided into three sections 602, 604, and 606, each section depicting a voltage-over-time relationship (waveform) of a specific type of signal. For example, a first section 602 illustrates a waveform of a signal 608 of a wordline (WL). A second section 604 illustrates a waveform of a conventional signal 610 at a conventional node q, wherein the conventional node q is a bitcell node coupled to a bitline of a conventional write driver circuit. The second section 604 also illustrates a waveform of a signal 612 at a node q, wherein the node q is a bitcell node coupled to the bitline (bl) 404 of the write driver circuit 400. A third section 606 illustrates a waveform of a signal 614 at a conventional first write driver node (conventional wd) of a conventional write driver circuit. The third section 606 also illustrates a waveform of a signal 616 at the first write driver node (wd) of the write driver circuit 400.

In an aspect, referring to the second section 604, a conventional static noise margin (SNM) 618 may be determined by comparing the waveform of the conventional signal 610 at the conventional node q to a predetermined value 630. Similarly, a static noise margin (SNM) of the write driver circuit 400 may be determined by comparing the waveform of the signal 612 at the node q to the predetermined value 630. As shown in the section 604, the write driver circuit 400 yields an improved SNM 620 as compared to the conventional SNM 618 of the conventional write driver circuit.

Figure 7:
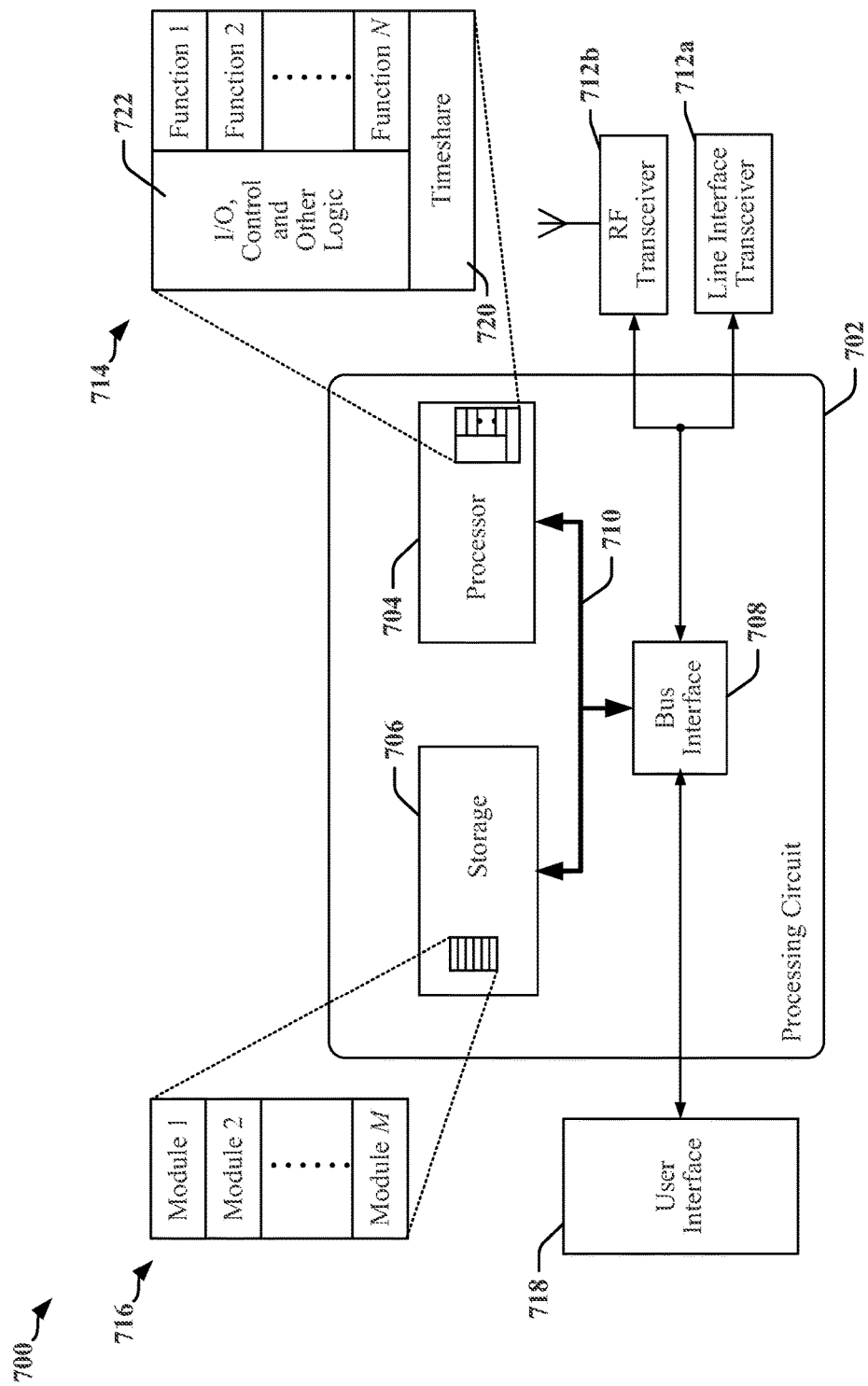
FIG. 7 illustrates an example of an apparatus employing a processing circuit that may be adapted according to certain aspects disclosed herein.

FIG. 7 illustrates an example of an apparatus employing a processing circuit that may be adapted according to certain aspects disclosed herein. In some examples, the apparatus 700 may perform one or more functions disclosed herein. In accordance with various aspects of the disclosure, an element, or any portion of an element, or any combination of elements as disclosed herein may be implemented using a processing circuit 702. The processing circuit 702 may include one or more processors 704 that are controlled by some combination of hardware and software modules. Examples of processors 704 include microprocessors, microcontrollers, digital signal processors (DSPs), SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 704 may include specialized processors that perform specific functions, and that may be configured, augmented or controlled by one of the software modules 716. The one or more processors 704 may be configured through a combination of software modules 716 loaded during initialization, and further configured by loading or unloading one or more software modules 716 during operation.

In the illustrated example, the processing circuit 702 may be implemented with a bus architecture, represented generally by the bus 710. The bus 710 may include any number of interconnecting buses and bridges depending on the specific application of the processing circuit 702 and the overall design constraints. The bus 710 links together various circuits including the one or more processors 704, and storage 706. Storage 706 may include memory devices and mass storage devices, and may be referred to herein as computer-readable media and/or processor-readable media. The bus 710 may also link various other circuits such as timing sources, timers, peripherals, voltage regulators, and power management circuits. A bus interface 708 may provide an interface between the bus 710 and one or more transceivers 712a, 712b. A transceiver 712a, 712b may be provided for each networking technology supported by the processing circuit. In some instances, multiple networking technologies may share some or all of the circuitry or processing modules found in a transceiver 712a, 712b. Each transceiver 712a, 712b provides a means for communicating with various other apparatus over a transmission medium. In one example, a transceiver 712a may be used to couple the apparatus 700 to a multi-wire bus. In another example, a transceiver 712b may be used to connect the apparatus 700 to a wireless network. Depending upon the nature of the apparatus 700, a user interface 718 (e.g., keypad, display, speaker, microphone, joystick) may also be provided, and may be communicatively coupled to the bus 710 directly or through the bus interface 708.

A processor 704 may be responsible for managing the bus 710 and for general processing that may include the execution of software stored in a computer-readable medium that may include the storage 706. In this respect, the processing circuit 702, including the processor 704, may be used to implement any of the methods, functions and techniques disclosed herein. The storage 706 may be used for storing data that is manipulated by the processor 704 when executing software, and the software may be configured to implement any one of the methods disclosed herein.

One or more processors 704 in the processing circuit 702 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 706 or in an external computer-readable medium. The external computer-readable medium and/or storage 706 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 706 may also include, by way of example, a carrier wave, a transmission line, and any other suitable medium for transmitting software and/or instructions that may be accessed and read by a computer. Computer-readable medium and/or the storage 706 may reside in the processing circuit 702, in the processor 704, external to the processing circuit 702, or be distributed across multiple entities including the processing circuit 702. The computer-readable medium and/or storage 706 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 706 may maintain software maintained and/or organized in loadable code segments, modules, applications, programs, etc., which may be referred to herein as software modules 716. Each of the software modules 716 may include instructions and data that, when installed or loaded on the processing circuit 702 and executed by the one or more processors 704, contribute to a run-time image 714 that controls the operation of the one or more processors 704. When executed, certain instructions may cause the processing circuit 702 to perform functions in accordance with certain methods, algorithms and processes described herein.

Some of the software modules 716 may be loaded during initialization of the processing circuit 702, and these software modules 716 may configure the processing circuit 702 to enable performance of the various functions disclosed herein. For example, some software modules 716 may configure internal devices and/or logic circuits 722 of the processor 704, and may manage access to external devices such as the transceiver 712, the bus interface 708, the user interface 718, timers, mathematical coprocessors, and so on. The software modules 716 may include a control program and/or an operating system that interacts with interrupt handlers and device drivers, and that controls access to various resources provided by the processing circuit 702. The resources may include memory, processing time, access to the transceiver 712, the user interface 718, and so on.

One or more processors 704 of the processing circuit 702 may be multifunctional, whereby some of the software modules 716 are loaded and configured to perform different functions or different instances of the same function. The one or more processors 704 may additionally be adapted to manage background tasks initiated in response to inputs from the user interface 718, the transceiver 712, and device drivers, for example. To support the performance of multiple functions, the one or more processors 704 may be configured to provide a multitasking environment, whereby each of a plurality of functions is implemented as a set of tasks serviced by the one or more processors 704 as needed or desired. In one example, the multitasking environment may be implemented using a timesharing program 720 that passes control of a processor 704 between different tasks, whereby each task returns control of the one or more processors 704 to the timesharing program 720 upon completion of any outstanding operations and/or in response to an input such as an interrupt. When a task has control of the one or more processors 704, the processing circuit is effectively specialized for the purposes addressed by the function associated with the controlling task. The timesharing program 720 may include an operating system, a main loop that transfers control on a round-robin basis, a function that allocates control of the one or more processors 704 in accordance with a prioritization of the functions, and/or an interrupt driven main loop that responds to external events by providing control of the one or more processors 704 to a handling function.

Figure 8:
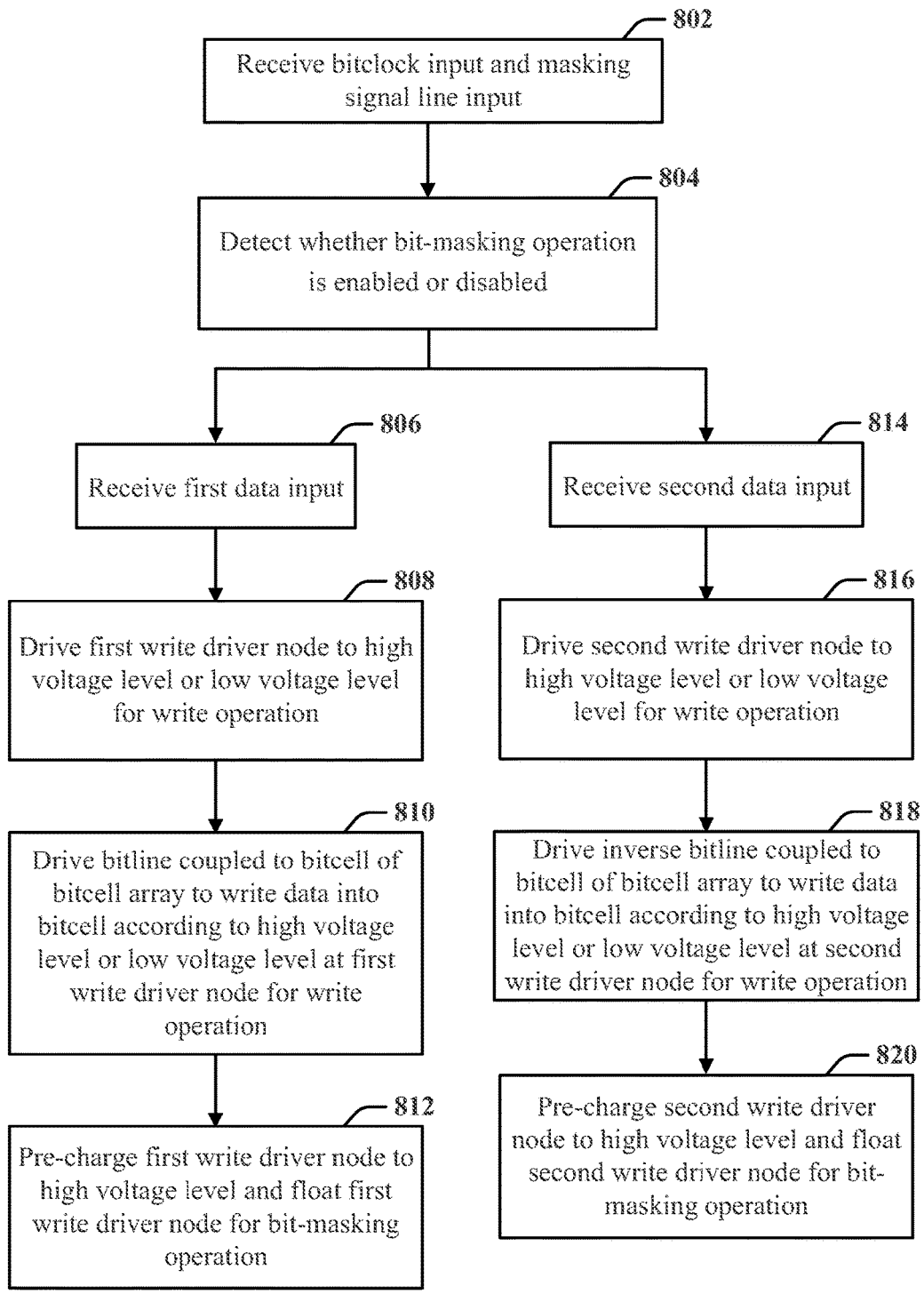
FIG. 8 is a flowchart of a method that may be performed at an apparatus for writing data into a static random access memory (SRAM).

FIG. 8 is a flowchart 800 of a method that may be performed at an apparatus (e.g., one of a cellular phone and a mobile computing device incorporating a static random access memory (SRAM)) for writing data into the SRAM.

At block 802, the apparatus may receive (e.g., via first pre-charging circuit 416 and second pre-charging circuit 418) a bitclock input (e.g., bclk) and a masking signal line input (e.g., wbt_n). The masking signal line input may enable or disable a bit-masking operation. At block 804, the apparatus may detect (e.g., via first pre-charging circuit 416 and second pre-charging circuit 418) whether the bit-masking operation is enabled or disabled based on a voltage value of the masking signal line input. In an aspect, the masking signal line input may control the first pre-charging circuit 416 or the second pre-charging circuit 418) to operate with a driving circuit (e.g., first driving circuit 410 or second driving circuit 414) in a case that the bit-masking operation is disabled. In a further aspect, the bitclock input may control the first pre-charging circuit 416/second pre-charging circuit 418 to operate with the first driving circuit 410/second driving circuit 414 to pre-charge a write driver node (e.g., wd or wd_n) to a high voltage level and float the write driver node for the bit-masking operation.

At block 806, the apparatus may receive (e.g., via first driving circuit 410) a first data input (e.g., gdin). At block 808, the apparatus may drive (e.g., via first driving circuit 410) a first write driver node (e.g., wd) to a high voltage level or a low voltage level for a write operation. In an aspect, the first write driver node is driven to the high voltage level or the low voltage level based on the masking signal line input when the masking signal line input disables the bit-masking operation. In a further aspect, the first write driver node is driven to the high voltage level or the low voltage level further based on a voltage value of the first data input.

At block 810, the apparatus may drive (e.g., via first driving circuit 410) a bitline (e.g., bl 404) coupled to a bitcell of a bitcell array (e.g., bitcell array 402) to write the data into the bitcell according to the high voltage level or the low voltage level at the first write driver node for the write operation.

At block 812, the apparatus may pre-charge (e.g., via first pre-charging circuit 416 and first driving circuit 410) the first write driver node to the high voltage level and float the first write driver node for the bit-masking operation. In an aspect, the first write driver node is pre-charged to the high voltage level based on the bitclock input when the masking signal line input enables the bit-masking operation. As such, a threshold voltage level for writing the data into the bitcell is maintained on the bitline at a start of a write cycle when the first write driver node floats at the high voltage level.

In an aspect, subsequent to block 804, the apparatus may perform the operations of blocks 814 to 820 in parallel with the operations of blocks 806 to 812.

At block 814, the apparatus may receive (e.g., via second driving circuit 414) a second data input (e.g., gdin_n). At block 816, the apparatus may drive (e.g., via second driving circuit 414) a second write driver node (e.g., wd_n) to a high voltage level or a low voltage level for the write operation. In an aspect, the second write driver node is driven to the high voltage level or the low voltage level based on the masking signal line input (e.g., wbt_n) when the masking signal line input disables the bit-masking operation. In a further aspect, the second write driver node is driven to the high voltage level or the low voltage level further based on a voltage value of the second data input.

At block 818, the apparatus may drive an inverse bitline (e.g., blb 406) coupled to the bitcell of the bitcell array (e.g., bitcell array 402) to write the data into the bitcell according to the high voltage level or the low voltage level at the second write driver node for the write operation.

At block 820, the apparatus may pre-charge (via second pre-charging circuit 418 and second driving circuit 414) the second write driver node to the high voltage level and float the second write driver node for the bit-masking operation. In an aspect, the second write driver node is pre-charged to the high voltage level based on the bitclock input (e.g. bclk) when the masking signal line input enables the bit-masking operation. As such, a threshold voltage level for writing the data into the bitcell is maintained on the inverse bitline at a start of a write cycle when the second write driver node floats at the high voltage level.

Figure 9:
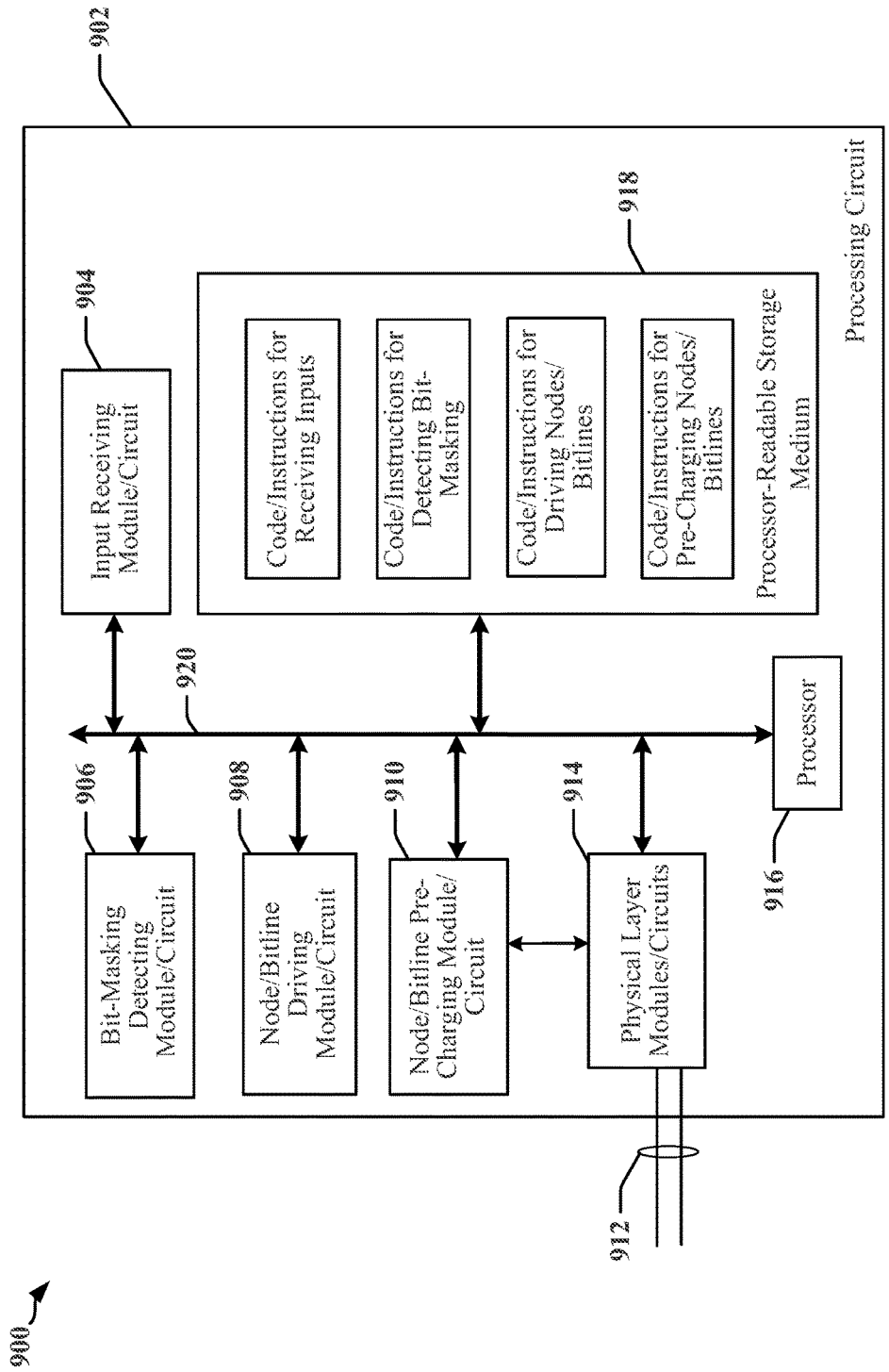
FIG. 9 illustrates an example of a hardware implementation for an apparatus adapted in accordance with certain aspects disclosed herein.

FIG. 9 is a diagram illustrating an example of a hardware implementation for an apparatus 900 employing a processing circuit 902. The apparatus may implement a bridging circuit in accordance with certain aspects disclosed herein. The processing circuit typically has a controller or processor 916 that may include one or more microprocessors, microcontrollers, digital signal processors, sequencers and/or state machines. The processing circuit 902 may be implemented with a bus architecture, represented generally by the bus 920. The bus 920 may include any number of interconnecting buses and bridges depending on the specific application of the processing circuit 902 and the overall design constraints. The bus 920 links together various circuits including one or more processors and/or hardware modules, represented by the controller or processor 916, the modules or circuits 904, 906, 908, and 910 and the processor-readable storage medium 918. One or more physical layer circuits and/or modules 914 may be provided to support communications over a communication link implemented using a multi-wire bus 912 or other communication structure. The bus 920 may also link various other circuits such as timing sources, peripherals, voltage regulators, and power management circuits, which are well known in the art, and therefore, will not be described any further.

The processor 916 is responsible for general processing, including the execution of software, code and/or instructions stored on the processor-readable storage medium 918. The processor-readable storage medium may include a non-transitory storage medium. The software, when executed by the processor 916, causes the processing circuit 902 to perform the various functions described supra (e.g., the functions described with respect to FIG. 8) for any particular apparatus. The processor-readable storage medium may be used for storing data that is manipulated by the processor 916 when executing software. The processing circuit 902 further includes at least one of the modules 904, 906, 908, and 910. The modules 904, 906, 908 and 910 may be software modules running in the processor 916, resident/stored in the processor-readable storage medium 918, one or more hardware modules coupled to the processor 916, or some combination thereof. The modules 904, 906, 908, and 910 may include microcontroller instructions, state machine configuration parameters, or some combination thereof.

In one configuration, the apparatus 900 includes modules and/or circuits 904 configured to receive a first data input, a second data input, a bitclock input, and/or a masking signal line input, modules and/or circuits 906 configured to detect whether a bit-masking operation is enabled or disabled, modules and/or circuits 908 configured to drive a write driver node/bitcell to a high voltage level or a low voltage level for a write operation, and modules and/or circuits 910 configured to pre-charge a write driver node/bitcell to a high voltage level and float the write driver node for a bit-masking operation.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. An apparatus, comprising:
 a static random access memory (SRAM), wherein the SRAM includes:
 a bitcell array;
 a bitline coupled to the bitcell array;
 a driving circuit configured to drive the bitline via a write driver node for writing data into a bitcell of the bitcell array for a write operation; and
 a pre-charging circuit configured to operate with the driving circuit to:
  drive the write driver node to a high voltage level or a low voltage level for the write operation,
  pre-charge the write driver node to the high voltage level to maintain a threshold voltage level on the bitline for writing the data into the bitcell at a start of a write cycle, and
  float the write driver node for a bit-masking operation.

2. The apparatus of claim 1, wherein:
 the pre-charging circuit is coupled to a masking signal line input, wherein the masking signal line input controls the pre-charging circuit to operate with the driving circuit to drive the write driver node to the high voltage level or the low voltage level in a case that the bit-masking operation is disabled.

3. The apparatus of claim 2, wherein:
 the pre-charging circuit is coupled to a bitclock input, wherein the bitclock input controls the pre-charging circuit to operate with the driving circuit to pre-charge the write driver node to the high voltage level and to float the write driver node for the bit-masking operation.

4. The apparatus of claim 1, further including:
 an inverse bitline coupled to the bitcell array;
 a second driving circuit configured to drive the inverse bitline via a second write driver node for writing the data into the bitcell for the write operation; and
 a second pre-charging circuit configured to operate with the second driving circuit to:
  drive the second write driver node to the high voltage level or the low voltage level for the write operation,
  pre-charge the second write driver node to the high voltage level, and
  float the second write driver node for the bit-masking operation.

5. The apparatus of claim 4, wherein:
 the second pre-charging circuit is coupled to a masking signal line input, wherein the masking signal line input controls the second pre-charging circuit to operate with the second driving circuit to drive the second write driver node to the high voltage level or the low voltage level in a case that the bit-masking operation is disabled.

6. The apparatus of claim 5, wherein:
the second pre-charging circuit is coupled to a bitclock input, wherein the bitclock input controls the second pre-charging circuit to operate with the second driving circuit to pre-charge the second write driver node to the high voltage level and to float the second write driver node for the bit-masking operation.

7. The apparatus of claim 4, wherein the threshold voltage level for writing the data into the bitcell is maintained on the inverse bitline at the start of the write cycle in a case that the second write driver node floats at the high voltage level.

8. The apparatus of claim 1, further comprising:
one of a cellular phone and a mobile computing device incorporating the SRAM.

9. A method for writing data into a static random access memory (SRAM), comprising:
detecting whether a bit-masking operation is enabled or disabled;
driving a write driver node to a high voltage level or a low voltage level for a write operation;
pre-charging the write driver node to the high voltage level to maintain a threshold voltage level on a bitline coupled to a bitcell of a bitcell array for writing data into the bitcell at a start of a write cycle;
floating the write driver node for the bit-masking operation; and
driving the bitline to write the data into the bitcell according to the high voltage level or the low voltage level at the write driver node for the write operation.

10. The method of claim 9, further including receiving a masking signal line input, wherein the masking signal line input controls to drive the write driver node to the high voltage level or the low voltage level in a case that the bit-masking operation is disabled.

11. The method of claim 10, further including receiving a bitclock input, wherein the bitclock input controls to pre-charge the write driver node at the high voltage level and to float the write driver node for the bit-masking operation.

12. The method of claim 9, further including:
driving a second write driver node to the high voltage level or the low voltage level for the write operation;
pre-charging the second write driver node to the high voltage level;
floating the second write driver node for the bit-masking operation; and
driving an inverse bitline coupled to the bitcell to write the data into the bitcell according to the high voltage level or the low voltage level at the second write driver node for the write operation.

13. The method of claim 12, further including receiving a masking signal line input, wherein the masking signal line input controls to drive the second write driver node to the high voltage level or the low voltage level in a case that the bit-masking operation is disabled.

14. The method of claim 13, further including receiving a bitclock input, wherein the bitclock input controls to pre-charge the second write driver node at the high voltage level and to float the second write driver node for the bit-masking operation.

15. The method of claim 12, wherein the threshold voltage level for writing the data into the bitcell is maintained on the inverse bitline at the start of the write cycle in a case that the second write driver node floats at the high voltage level.

16. An apparatus for writing data into a static random access memory (SRAM), comprising:
means for detecting whether a bit-masking operation is enabled or disabled;
means for driving a write driver node to a high voltage level or a low voltage level for a write operation;
means for pre-charging the write driver node to the high voltage level to maintain a threshold voltage level on a bitline coupled to a bitcell of a bitcell array for writing data into the bitcell at a start of a write cycle;
means for floating the write driver node for the bit-masking operation; and
means for driving the bitline to write the data into the bitcell according to the high voltage level or the low voltage level at the write driver node for the write operation.

17. The apparatus of claim 16, further including means for receiving a masking signal line input, wherein the masking signal line input controls to drive the write driver node to the high voltage level or the low voltage level in a case that the bit-masking operation is disabled.

18. The apparatus of claim 17, further including means for receiving a bitclock input, wherein the bitclock input controls to pre-charge the write driver node at the high voltage level and to float the write driver node for the bit-masking operation.

19. The apparatus of claim 16, further including:
means for driving a second write driver node to the high voltage level or the low voltage level for the write operation;
means for pre-charging the second write driver node to the high voltage level;
means for floating the second write driver node for the bit-masking operation; and
means for driving an inverse bitline coupled to the bitcell to write the data into the bitcell according to the high voltage level or the low voltage level at the second write driver node for the write operation.

20. The apparatus of claim 19, further including means for receiving a masking signal line input, wherein the masking signal line input controls to drive the second write driver node to the high voltage level or the low voltage level in a case that the bit-masking operation is disabled.

21. The apparatus of claim 20, further including means for receiving a bitclock input, wherein the bitclock input controls to pre-charge the second write driver node at the high voltage level and to float the second write driver node for the bit-masking operation.

22. The apparatus of claim 19, wherein the threshold voltage level for writing the data into the bitcell is maintained on the inverse bitline at the start of the write cycle in a case that the second write driver node floats at the high voltage level.

23. An apparatus, comprising:
a static random access memory (SRAM); and
a write driver circuit for writing data into the SRAM, the write driver circuit configured to:
detect whether a bit-masking operation is enabled or disabled,
drive a write driver node to a high voltage level or a low voltage level for a write operation,
pre-charge the write driver node to the high voltage level to maintain a threshold voltage level on a bitline coupled to a bitcell of a bitcell array for writing data into the bitcell at a start of a write cycle,
float the write driver node for the bit-masking operation, and drive the bitline to write the data into the bitcell according to the high voltage level or the low voltage level at the write driver node for the write operation.

24. The apparatus of claim 23, wherein the write driver circuit is further configured to:

receive a bitclock input and a masking signal line input, wherein the masking signal line input controls to drive the write driver node to the high voltage level or the low voltage level in a case that the bit-masking operation is disabled, and wherein the bitclock input controls to pre-charge the write driver node at the high voltage level and to float the write driver node for the bit-masking operation.

25. The apparatus of claim 23, wherein the write driver circuit is further configured to:

drive a second write driver node to the high voltage level or the low voltage level for the write operation;

pre-charge the second write driver node to the high voltage level;

float the second write driver node for the bit-masking operation; and drive an inverse bitline coupled to the bitcell to write the data into the bitcell according to the high voltage level or the low voltage level at the second write driver node for the write operation.

26. The apparatus of claim 25, wherein the write driver circuit is further configured to:

receive a bitclock input and a masking signal line input, wherein the masking signal line input controls to drive the second write driver node to the high voltage level or the low voltage level in a case that the bit-masking operation is disabled, wherein the bitclock input controls to pre-charge the second write driver node at the high voltage level and to float the second write driver node for the bit-masking operation, and wherein the threshold voltage level for writing the data into the bitcell is maintained on the inverse bitline at the start of the write cycle in a case that the second write driver node floats at the high voltage level.

27. The apparatus of claim 23, further comprising:

one of a cellular phone and a mobile computing device incorporating the SRAM and the write driver circuit.

* * * * *